(12) United States Patent
Yamamoto et al.

(10) Patent No.: US 12,610,769 B2
(45) Date of Patent: Apr. 21, 2026

(54) PROCESSING METHOD

(71) Applicant: DISCO CORPORATION, Tokyo (JP)

(72) Inventors: Naoko Yamamoto, Tokyo (JP);
Tomoaki Sugiyama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 572 days.

(21) Appl. No.: 18/344,025

(22) Filed: Jun. 29, 2023

(65) Prior Publication Data

US 2024/0006241 A1 Jan. 4, 2024

(30) Foreign Application Priority Data

Jul. 1, 2022 (JP) ................................. 2022-107407

(51) Int. Cl.
| | |
|---|---|
| *H10P 54/00* | (2026.01) |
| *H10P 52/00* | (2026.01) |
| *H10P 72/00* | (2026.01) |
| *H10P 72/70* | (2026.01) |

(52) U.S. Cl.
CPC .............. *H10P 54/00* (2026.01); *H10P 52/00* (2026.01); *H10P 72/0428* (2026.01); *H10P 72/7402* (2026.01)

(58) Field of Classification Search
None
See application file for complete search history.

(56) References Cited

U.S. PATENT DOCUMENTS

| | | | | |
|---|---|---|---|---|
| 5,128,282 A | * | 7/1992 | Ormond .................. | H10P 52/00 257/E21.237 |
| 2003/0121511 A1 | * | 7/2003 | Hashimura ........... | H10P 50/692 257/E21.232 |
| 2006/0223234 A1 | * | 10/2006 | Terayama ........... | H10P 72/7402 438/460 |
| 2007/0218586 A1 | * | 9/2007 | Yoshimura .............. | H10P 54/00 438/106 |
| 2008/0251188 A1 | * | 10/2008 | Sekiya ................ | B32B 38/0004 156/153 |
| 2019/0122928 A1 | * | 4/2019 | Norimoto ............... | H10P 54/00 |
| 2019/0214299 A1 | * | 7/2019 | Kamseder ............... | H10P 52/00 |
| 2023/0317521 A1 | * | 10/2023 | Su ........................... | H10P 54/00 |

FOREIGN PATENT DOCUMENTS

JP 2018041896 A 3/2018

* cited by examiner

*Primary Examiner* — Erik T. K. Peterson
(74) *Attorney, Agent, or Firm* — Greer Burns & Crain Ltd.

(57) ABSTRACT

A laminate substrate is divided along a plurality of intersecting scheduled division lines. The laminate substrate has a first substrate and a second substrate formed of the same material, laminated through an intermediate layer containing metal. The laminate substrate is divided by cutting the laminate substrate along the scheduled division lines by use of a substrate cutting blade to form the first substrate with first cut grooves each having a width larger than a cutting edge thickness of a metal cutting blade which is larger in cutting edge thickness than the substrate cutting blade, and thereafter cutting the laminate substrate along the first cut grooves by use of the metal cutting blade to cut the intermediate layer and to form second cut grooves each having a width corresponding to the cutting edge thickness of the metal cutting blade.

3 Claims, 11 Drawing Sheets

PROCESSING METHOD

BACKGROUND OF THE INVENTION

Field of the Invention

The present invention relates to a processing method for dividing, along a plurality of intersecting scheduled division lines, a laminate substrate in which a first substrate and a second substrate formed of a material same as that of the first substrate are laminated with each other through an intermediate layer containing metal.

Description of the Related Art

In cutting of a laminate substrate as disclosed in, for example, Japanese Patent Laid-open No. 2018-041896, use of two kinds of cutting blades, namely, a first cutting blade for a silicon substrate and a second cutting blade for a glass substrate, has hitherto been known, in which a cutting blade most suitable for the material of a workpiece is selected.

Particularly, in the case of a laminate substrate in which substrates formed of different materials are laminated, if it is intended to cut the laminate substrate by use of one kind of cutting blade, there would arise marked defects called chipping at edges of cut grooves. In view of this, a method of stepwise cutting of the substrates of the laminate substrate by use of cutting blades suitable for the respective substrates has been adopted.

SUMMARY OF THE INVENTION

Examples of the laminate substrate include a laminate substrate of a three-layer structure in which front surfaces of silicon wafers each formed on the front surface thereof with a plurality of devices are joined to each other such that an intermediate layer of a different material is interposed between substrates of the same kind, such as a three-dimensional laminate device wafer.

To process such a laminate substrate, there may be considered a method in which the substrates as outer layers are cut from front and back sides of the laminate substrate by use of a substrate cutting blade, followed by cutting the intermediate layer by use of an intermediate layer cutting blade, or a method in which one substrate is cut by use of a substrate cutting blade from one side, then the intermediate layer is cut by use of an intermediate layer cutting blade, and the other substrate is cut by use of the substrate cutting blade from the other side.

However, in either of the two methods, the laminate substrate once formed with cut grooves needs to be reversed for further processing, and the substrate may be damaged at the time of reversion.

Accordingly, it is an object of the present invention to provide a novel processing method for cutting a laminate substrate in which an intermediate layer of a different kind is interposed between substrates of the same kind, by use of cutting blades.

In accordance with an aspect of the present invention, there is provided a processing method for dividing, along a plurality of intersecting scheduled division lines, a laminate substrate in which a first substrate and a second substrate formed of a material same as that of the first substrate are laminated with each other through an intermediate layer containing metal. The processing method includes a blade preparing step of preparing a substrate cutting blade and a metal cutting blade larger in cutting edge thickness than the substrate cutting blade, a support member disposing step of disposing a support member on the second substrate side of the laminate substrate, a holding step of holding the laminate substrate by a holding table through the support member such that the first substrate is exposed, a first cutting step of cutting the laminate substrate held by the holding table along the scheduled division lines by use of the substrate cutting blade to form the first substrate with first cut grooves each having a width larger than the cutting edge thickness of the metal cutting blade, a second cutting step of, after the first cutting step is carried out, cutting the laminate substrate held by the holding table along the first cut grooves by use of the metal cutting blade to cut the intermediate layer and to form second cut grooves each having a width corresponding to the cutting edge thickness of the metal cutting blade, and a third cutting step of, after the second cutting step is carried out, cutting the laminate substrate held by the holding table along the second cut grooves by use of the substrate cutting blade to divide the second substrate, thereby dividing the laminate substrate. In the first cutting step, the substrate cutting blade is relatively moved multiple times in an indexing-feed direction with respect to each scheduled division line to thereby carry out cutting multiple times along the scheduled division line.

Preferably, the metal cutting blade is set to have a thickness larger than the cutting edge thickness of the substrate cutting blade but smaller than two times the cutting edge thickness of the substrate cutting blade, and in the first cutting step, the laminate substrate is cut twice along each scheduled division line by use of the substrate cutting blade to form the first cut grooves each having a width corresponding to two times the cutting edge thickness of the substrate cutting blade.

Preferably, in the first cutting step, the laminate substrate is cut twice along each scheduled division line by use of the substrate cutting blade to form the first cut groove in which two cut grooves are formed and an uncut residual part having a width smaller than the cutting edge thickness of the metal cutting blade is formed along the scheduled division line between the two cut grooves, and in the second cutting step, the intermediate layer is cut together with the uncut residual part by use of the metal cutting blade.

According to the present invention, cutting can be performed by use of the cutting blades suitable for cutting the respective substrates and the intermediate layer without reversing the laminate substrate, and generation of defects called chipping at edges of the cut grooves can be prevented. In addition, since the first to third cutting steps can be carried out while the laminate substrate is kept being held by the holding table and not reversed, damaging of the laminate substrate due to reversion of the laminate substrate or attaching and detaching of the laminate substrate onto and from the holding table can also be prevented. Further, since the reversion and the attaching/detaching of the laminate substrate are unnecessary, shortening of processing time can be realized.

Furthermore, that part of the first substrate which overlaps a region to be cut by use of the metal cutting blade can be removed by a minimum number of times of cutting, so that worsening of processing quality due to cutting of the first substrate by use of the metal cutting blade can be prevented.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
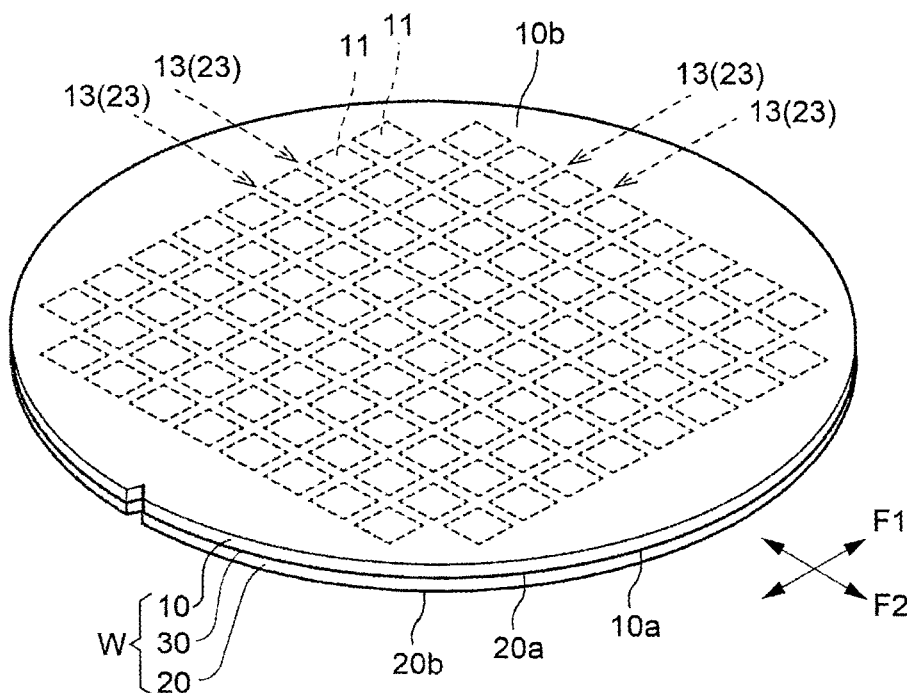
FIG. 1 is a perspective view of a laminate substrate to be processed by a processing method according to an embodiment of the present invention.
Figure 2:
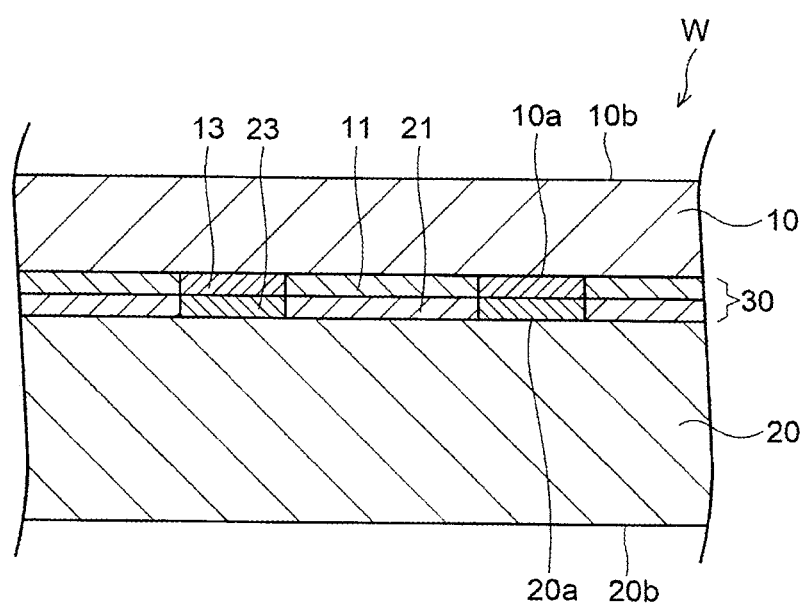
FIG. 2 is an enlarged sectional view of a part of the laminate substrate illustrated in FIG. 1.

Embodiments of the present invention will be described in detail below with reference to the attached drawings. FIGS. 1 and 2 are a perspective view depicting a laminate substrate W to be processed by a processing method according to an embodiment of the present invention and an enlarged sectional view of a part of the laminate substrate W, respectively.

As depicted in FIGS. 1 and 2, the laminate substrate W has a first substrate 10, a second substrate 20 formed of a material same as that of the first substrate 10, and an intermediate layer 30 containing metal between the two substrates. The first substrate 10 and the second substrate 20 are laminated with each other through the intermediate layer 30 to constitute the laminate substrate W.

The first substrate 10 and the second substrate 20 are, for example, silicon wafers, with devices 11 and 21 formed on front surfaces 10a and 20a of the respective substrates, and the first and second substrates 10 and 20 are bonded to each other in such a manner that positions of the devices 11 and 21 of the respective substrates coincide with each other, to constitute the laminate substrate W as a whole. Between adjacent ones of the devices 11 and 21 of the respective substrates, there are formed streets 13 and 23 including metallic wires, an interlayer insulating film, a test element group (TEG), and the like.

In the state in which the first substrate 10 and the second substrate 20 are laminated with each other, parts other than parts where the devices 11 and 21 are formed constitute the intermediate layer 30 containing metal. The streets 13 and 23 constitute parts of the intermediate layer 30 containing metal.

The streets 13 of the first substrate 10 extend in a first direction F1 and a second direction F2 orthogonal to each other and are arranged in a grid pattern. Similarly, the streets 23 of the second substrate 20 extend in the first direction F1 and the second direction F2 and are arranged in a grid pattern. Scheduled division lines are set along the streets 13 and 23, and the laminate substrate W is divided along the scheduled division lines into chips including the devices 11 and 21.

Note that the material of the first substrate 10 and the second substrate 20 is not particularly limited to any kind and may be glass, sapphire, SiC, GaN, and the like, other than silicon.

Figure 3:
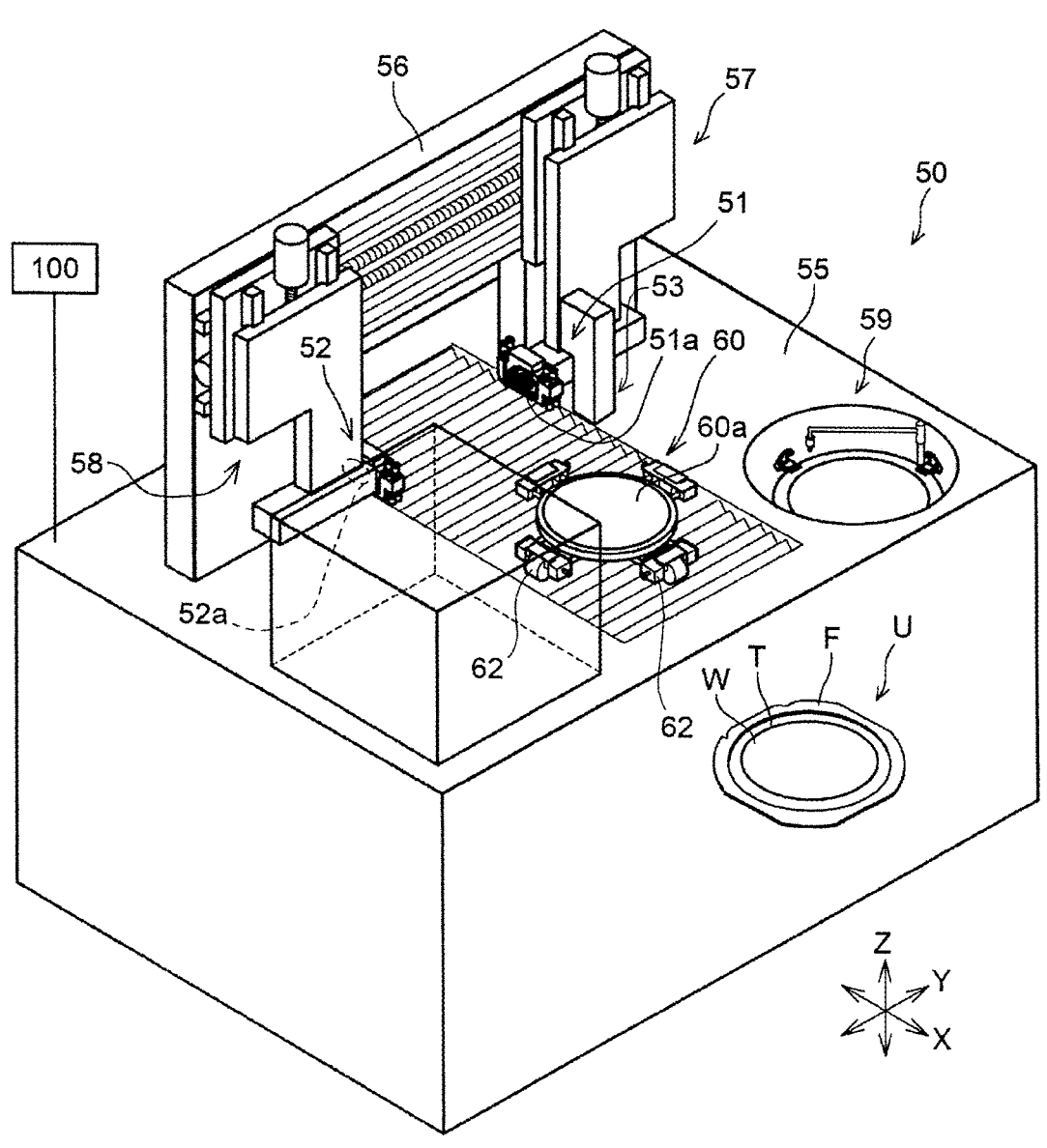
FIG. 3 is a perspective view of a cutting apparatus used for the processing method.

FIG. 3 is a diagram depicting an example of a cutting apparatus to be used for cutting the laminate substrate W.

The cutting apparatus, denoted by 50, is configured as a dual dicing saw having two cutting units 51 and 52 and is able to sequentially perform cutting by use of the two cutting units 51 and 52 for one scheduled division line.

A holding table 60 is disposed on a base 55 of the cutting apparatus 50. The holding table 60 is configured to be reciprocated in an X-axis direction, which is a processing-feed direction, by an unillustrated moving mechanism. In addition, the holding table 60 is configured to be rotated in a horizontal plane by an unillustrated rotating mechanism.

The holding table 60 is sequentially supplied with frame units U in each of which the laminate substrate W is adhered to an annular frame F through a tape T, and the laminate substrate W is held under suction on a holding surface 60a of the holding table 60 with the tape T interposed therebetween.

An imaging unit 53 for imaging the laminate substrate W is provided in the vicinity of the cutting unit 51, and a controller 100 sets the scheduled division lines of the laminate substrate W based on a picked-up image and rotates the holding table 60 to perform alignment (processing position detection). As the imaging unit 53, a visible light camera or an infrared (IR) camera is used according to the kind of the laminate substrate W, and the imaging unit 53 enables detection of a pattern in the laminate substrate W, setting of the scheduled division lines by the controller 100, and the alignment.

A column 56 in a gate-like shape is erected on the base 55 and is provided with moving mechanisms 57 and 58 for supporting, respectively, the first cutting unit 51 and the second cutting unit 52 movably in both a Y-axis direction and a Z-axis direction. The first cutting unit 51 is provided with a substrate cutting blade 51a driven to rotate by an unillustrated motor. The second cutting unit 52 is provided with a metal cutting blade 52a which is larger in cutting edge thickness than the substrate cutting blade 51a and is driven to rotate by an unillustrated motor.

A plurality of clamps 62 for clamping the annular frame F of the frame unit U are disposed in a periphery of the holding table 60. On the base 55 of the cutting apparatus 50, there is provided a cleaning unit 59 by which the laminate substrate W obtained after cutting is cleaned.

Figure 4:
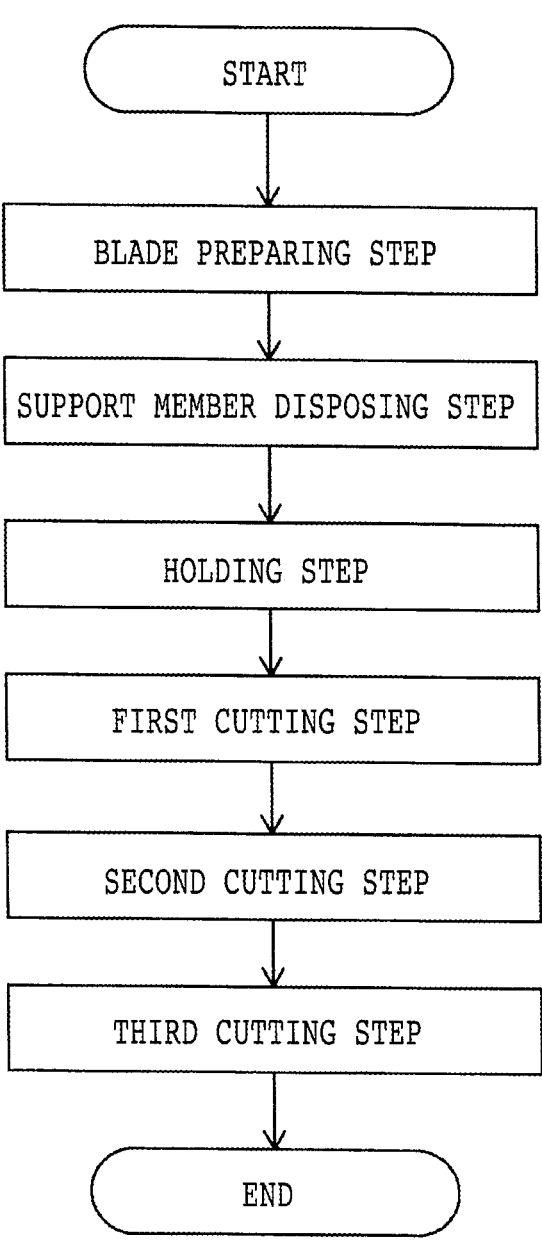
FIG. 4 is a flow chart depicting a procedure of the processing method according to the embodiment.

Next, the processing method for processing a wafer according to the embodiment of the present invention will be described. FIG. 4 is a flow chart depicting a procedure of the processing method according to the embodiment of the present invention. Each of steps of the processing method will sequentially be described below.

<Blade Preparing Step>

This step is a step of preparing the substrate cutting blade 51a and the metal cutting blade 52a larger in cutting edge thickness than the substrate cutting blade 51*a*, in the cutting apparatus 50 as depicted in FIG. 3.

The substrate cutting blade 51*a* is a blade suitable for cutting the first substrate 10 and the second substrate 20 depicted in FIG. 2 and is, for example, an electroformed blade having a thickness of 40 μm and a mesh size on the order of #3000 (grain diameter: 2 to 4 μm).

The metal cutting blade 52*a* is a blade suitable for cutting the intermediate layer 30 depicted in FIG. 2 and is, for example, a resin blade having a thickness of 50 μm and a mesh size on the order of #800 (grain diameter: 10 to 20 μm).

In addition, the metal cutting blade 52*a* is a blade more wearable than the substrate cutting blade 51*a*, and a blade lower in the degree of concentration than the substrate cutting blade 51*a* or a blade having a softer bond material than that of the substrate cutting blade 51*a* can be used as the metal cutting blade 52*a*.

Besides, as the metal cutting blade 52*a*, there can be used, for example, a blade having a cutting edge thickness larger than that of the substrate cutting blade 51*a* but smaller than two times the cutting edge thickness of the substrate cutting blade 51*a*.

<Support Member Disposing Step>

Figures 5A, 5B, 5C:
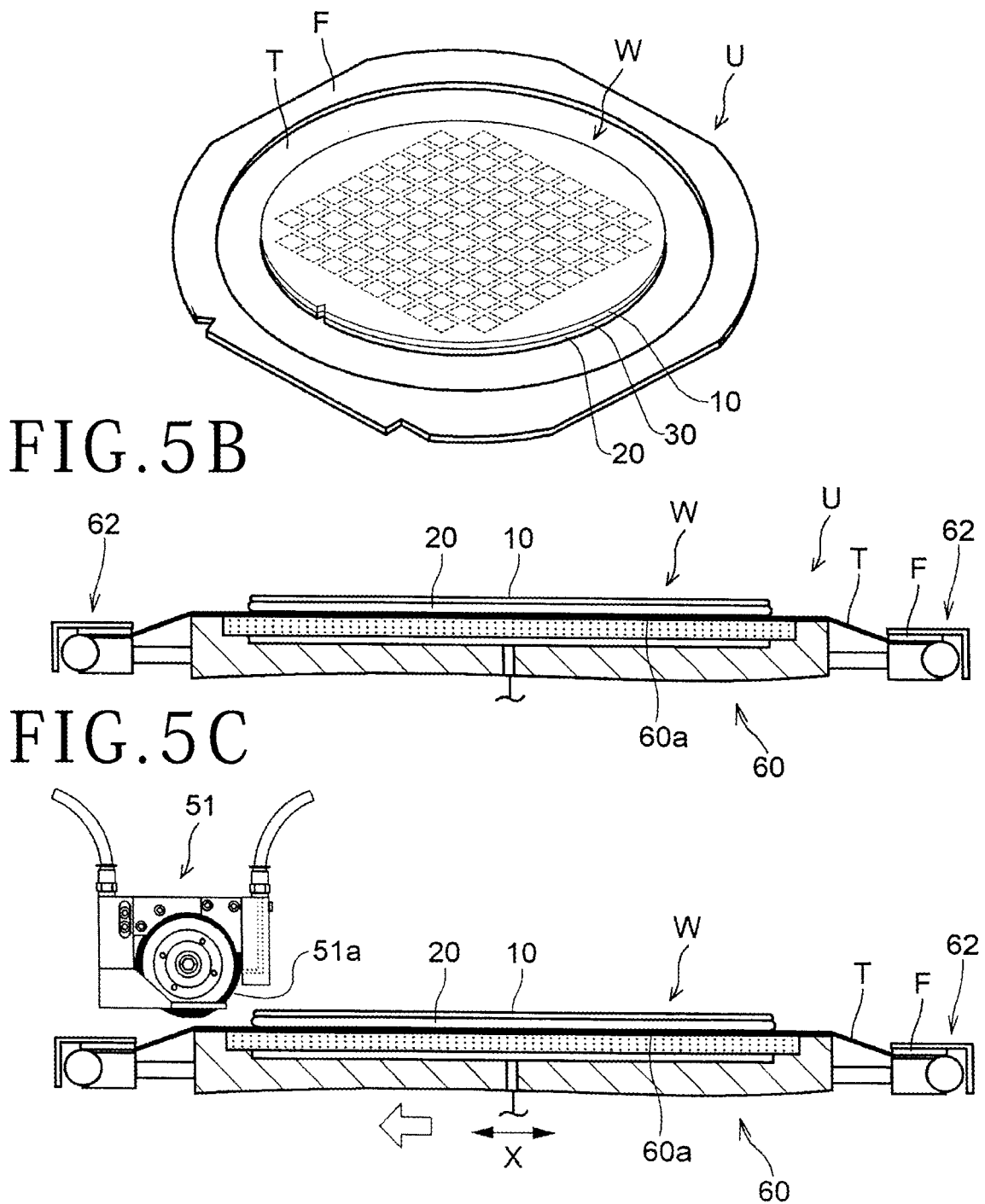
FIG. 5A is a perspective view depicting a support member disposing step of the processing method.
FIG. 5B is a sectional view depicting a holding step of the processing method.
FIG. 5C is a sectional view depicting a first cutting step of the processing method.

This step is a step of disposing the tape T as a support member on the second substrate 20 side of the laminate substrate W, as depicted in FIG. 5A. The tape T may be a tape that has a pressure sensitive adhesive layer or may be a tape that does not have a pressure sensitive adhesive layer.

In the present embodiment, as depicted in FIGS. 2 and 5B, the second substrate 20 which is thicker than the first substrate 10 is adhered to the tape T. As a result, as described in detail later, what is generally called half cutting of performing cutting (first cutting step) of the thin first substrate 10 while leaving intact the intermediate layer 30 and the second substrate 20 on a lower side can be conducted, making it possible to prevent cracking of the thin first substrate 10 which is liable to crack at the time of cutting. Particularly, since the probability of cracking is high when the thickness of the substrate is not more than 40 μm, it is preferable to carry out the half cutting of initially cutting only the substrate having a small thickness of not more than 40 μm without cutting into the intermediate layer nor the thick substrate.

In addition, as depicted in FIG. 5A, the annular frame F is fixed to the tape T in such a manner as to surround a periphery of the laminate substrate W, to constitute the frame unit U in which the laminate substrate W and the annular frame F are united together.

<Holding Step>

This step is a step of holding the laminate substrate W by the holding table 60 through the tape T, which is the support member, such that the first substrate 10 is exposed as depicted in FIG. 5B.

The holding surface 60*a* of the holding table 60 is connected to an unillustrated suction source, and the laminate substrate W is held under suction on the holding surface 60*a* with the tape T as the support member interposed therebetween. Further, the annular frame F is clamped by the clamps 62.

<First Cutting Step>

This step is a step of cutting the laminate substrate W held by the holding table 60 along the scheduled division lines by use of the substrate cutting blade 51*a* to form the first substrate 10 with first cut grooves each having a width larger than the cutting edge thickness of the metal cutting blade 52*a*, as depicted in FIG. 5C.

Specifically, first, the laminate substrate W is imaged by the imaging unit 53 depicted in FIG. 3 to perform alignment, thereby setting the scheduled division lines in the streets. Next, as depicted in FIG. 5C, the substrate cutting blade 51*a* is positioned at a cutting-in height and rotated at high speed while the holding table 60 is processing-fed in the processing-feed direction (X-axis direction), so that the first cut grooves, denoted by M1, are formed along the scheduled division lines, denoted by L, in the streets 13 of the first substrate 10 as depicted in FIGS. 6A and 6B.

Here, since the cutting edge thickness, denoted by 51*w* (FIG. 6A), of the substrate cutting blade 51*a* is smaller than the cutting edge thickness, denoted by 52*w* (FIG. 7A), of the metal cutting blade 52*a*, the groove forming by the substrate cutting blade 51*a* is conducted multiple times, so that a width W1 (FIG. 6D) of each first cut groove M1 is made to be larger than the cutting edge thickness 52*w* (FIG. 7A) of the metal cutting blade 52*a*.

In other words, as depicted in FIGS. 6A to 6F, the substrate cutting blade 51*a* is relatively moved in an indexing-feed direction (Y-axis direction) multiple times with respect to one scheduled division line L, so that the one scheduled division line L is cut multiple times.

Figures 6A, 6B, 6C, 6D, 6E, 6F:
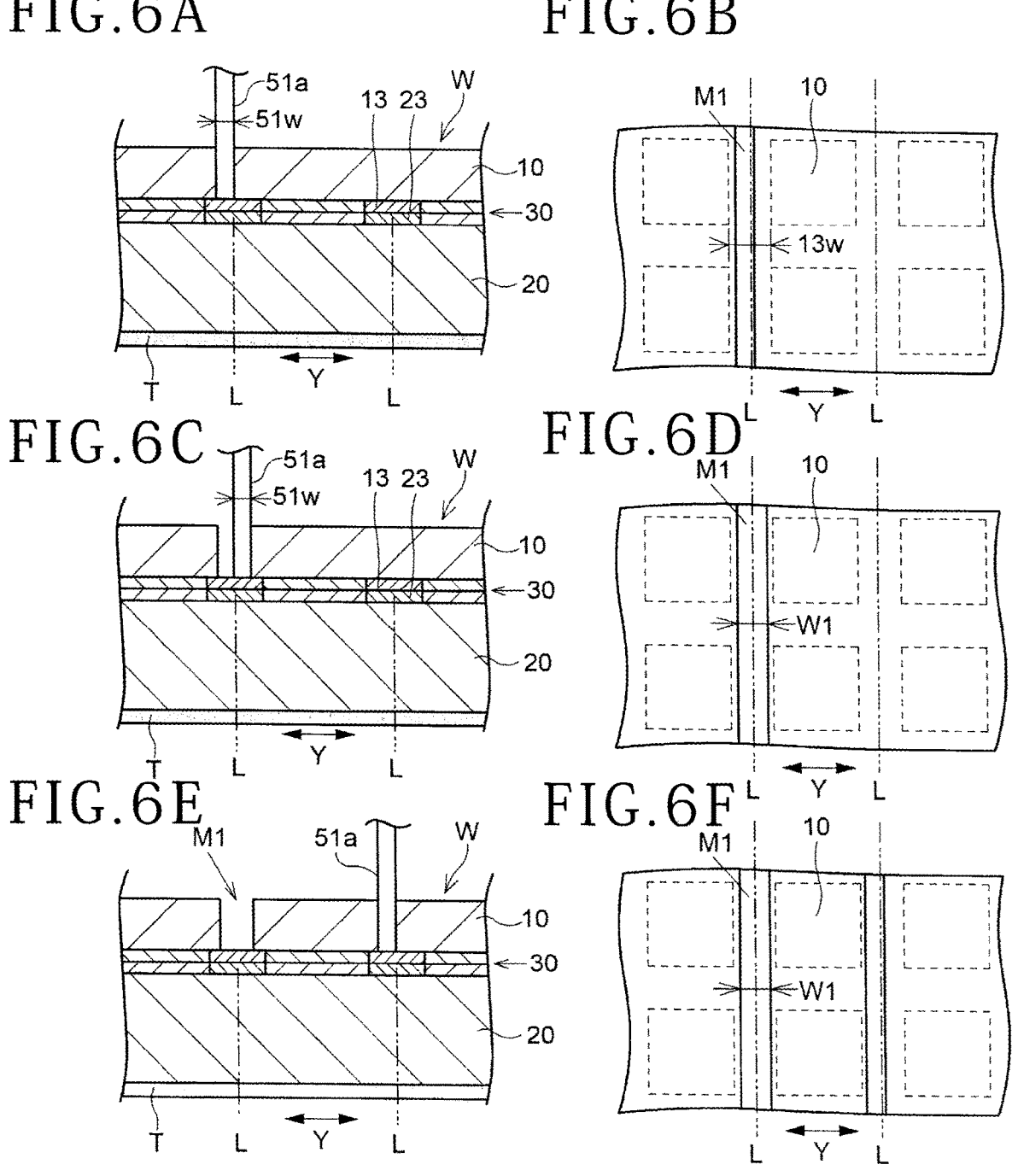
FIGS. 6A to 6F are diagrams for explaining the first cutting step.

More specifically, as depicted in FIGS. 6A and 6B, first, in regard of the first substrate 10, the substrate cutting blade 51*a* is positioned in such a manner that a center position of the cutting edge is deviated to one side from the position of the scheduled division line L, and first groove forming is performed along the scheduled division line L. Next, as depicted in FIGS. 6C and 6D, the substrate cutting blade 51*a* is positioned in such a manner that the center position of the cutting edge is deviated to the other side from the position of the scheduled division line L, and second groove forming is conducted along the scheduled division line L. As a result, the first cut groove M1 having the width W1 larger than the cutting edge thickness 52*w* (FIG. 7A) of the metal cutting blade 52*a* is formed. For the adjacent scheduled division line L, also, similar processing is carried out, as depicted in FIGS. 6E and 6F.

In the example of FIGS. 6A to 6F, each first cut groove M1 is formed in a range of the width 13*w* (FIG. 6B) of the street 13 by conducting the groove forming twice, but the number of times of the groove forming may be changed, for example, changed to be three, according to the cutting edge thickness 52*w* (FIG. 7A) of the metal cutting blade 52*a*. Note that, in the first cutting step, the intermediate layer 30 and the second substrate 20 are not cut, and half cutting is conducted for the laminate substrate W as a whole.

<Second Cutting Step>

This step is a step of cutting the laminate substrate W held by the holding table 60 (FIG. 5C) along the first cut grooves M1 by use of the metal cutting blade 52*a* of the second cutting unit 52 (FIG. 3) to divide the intermediate layer 30 and to form second cut grooves M2 each having a width corresponding to the cutting edge thickness 52*w* of the metal cutting blade 52*a*, after the first cutting step is carried out, as depicted in FIGS. 7A to 7D.

Figure 7A:
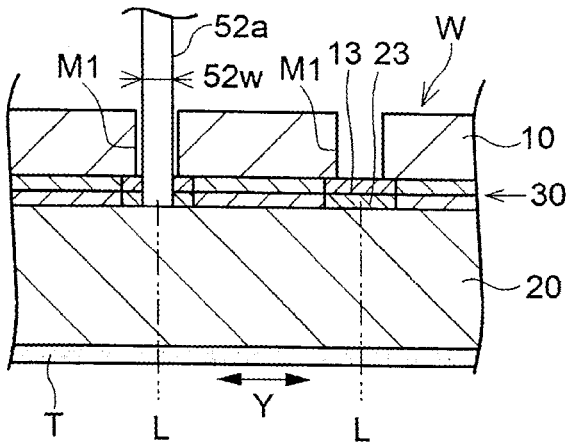
FIGS. 7A to 7D are diagrams for explaining a second cutting step of the processing method.
Figure 7B:
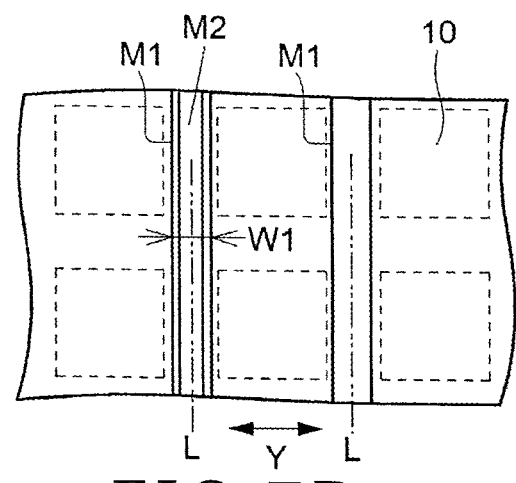
Figure 7C:
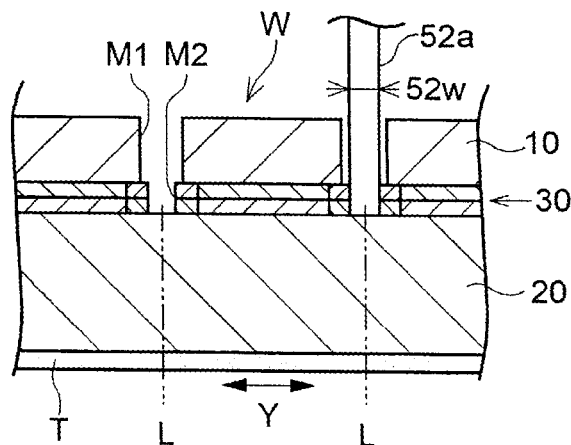
Figure 7D:
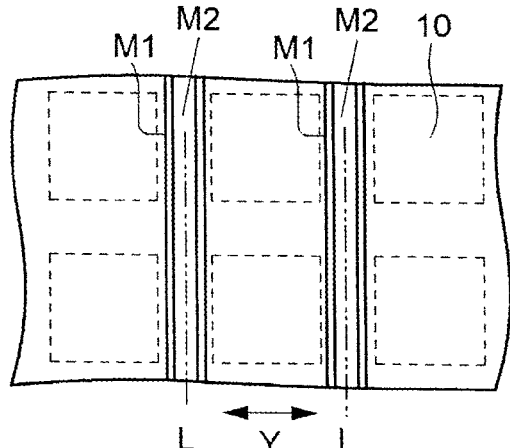

As depicted in FIGS. 7A and 7B, that part of the first substrate 10 which corresponds to the streets 13 and 23 of the intermediate layer 30 has been formed with the first cut groove M1, and the metal cutting blade 52*a* is made to cut into the streets 13 and 23 along the first cut groove M1, to thereby perform groove forming on the intermediate layer 30 containing metal. As a result, the second cut groove M2 is formed in a bottom of the first cut groove M1 as depicted in FIGS. 7C and 7D.

<Third Cutting Step>

This step is a step of cutting the laminate substrate W held by the holding table 60 (FIG. 5C) along the second cut grooves M2 by use of the substrate cutting blade 51*a*, to divide the second substrate 20 and to thereby divide the laminate substrate W, after the second cutting step is carried out, as depicted in FIG. 8A to 8D.

Figure 8A:
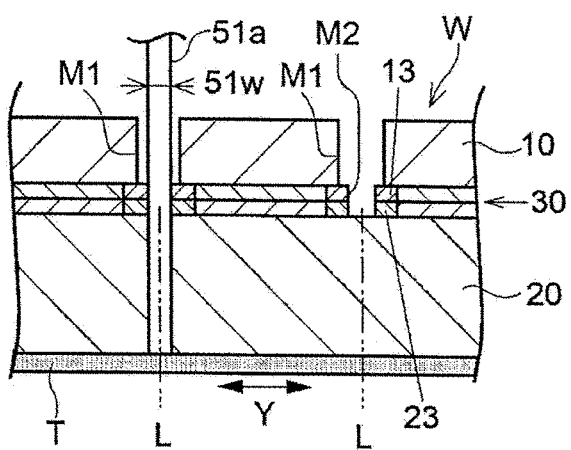
FIGS. 8A to 8D are diagrams for explaining a third cutting step of the processing method.
Figure 8B:
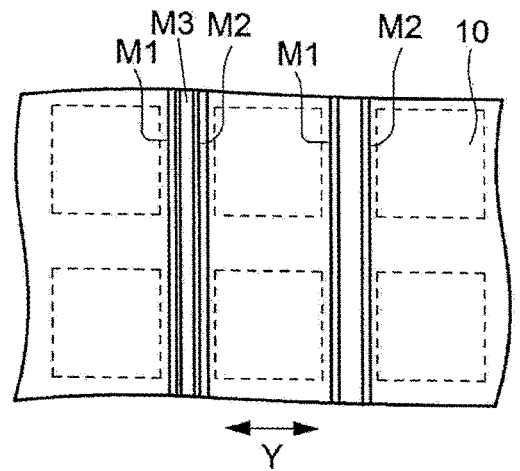

As depicted in FIGS. 8A and 8B, that part of the intermediate layer 30 which corresponds to the streets 13 and 23 has been formed with the second cut groove M2, and the substrate cutting blade 51*a* is made to cut into the second substrate 20 along the second cut groove M2, to thereby perform groove forming.

Figure 8C:
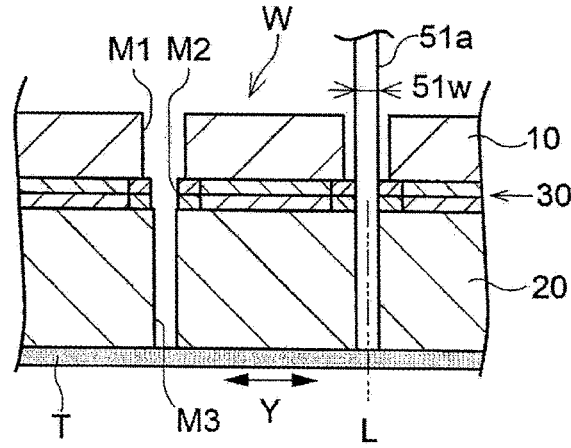
Figure 8D:
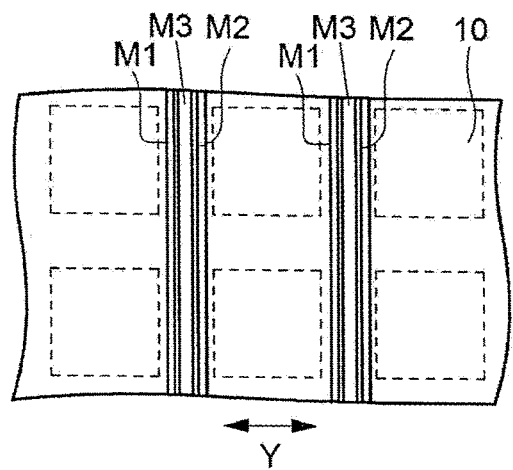

As a result, a third cut groove M3 is formed in a bottom of the second cut groove M2 as depicted in FIGS. 8C and 8D. The third cut groove M3 reaches the tape T which is the support member, so that the second substrate 20 is completely divided.

In the embodiment as described above, for one scheduled division line L (FIG. 6A), the first cut groove M1 (FIG. 6E) is formed by the groove forming conducted twice by use of the substrate cutting blade 51*a* of the first cutting unit 51 (FIG. 3) in the first cutting step, next, the second cut groove M2 (FIG. 7C) is formed by the groove forming conducted by use of the metal cutting blade 52*a* of the second cutting unit 52 (FIG. 3) in the second cutting step, and, subsequently, the third cut groove M3 (FIG. 8C) is formed by the groove forming conducted by use of the substrate cutting blade 51*a* of the first cutting unit 51 (FIG. 3) in the third cutting step. What is generally called step cutting as described above is carried out for all the streets 13 and 23 (FIG. 1), so that the laminate substrate W can be divided into chips.

In the processing method describe above, cutting can be conducted by use of cutting blades suitable for cutting each substrate and the intermediate layer without reversing the laminate substrate W, and generation of defects called chipping at edges of the cut grooves can be prevented. In addition, since the first to third cutting steps can be conducted while the laminate substrate W is kept being held by the holding table 60 and not reversed, damaging of the laminate substrate W arising from reversion of the laminate substrate W or attaching or detaching of the laminate substrate W onto or from the holding table 60 can also be prevented. Further, since reversion of the laminate substrate W and attaching/detaching of the laminate substrate W are unnecessary, shortening of processing time can be realized.

In addition, in the embodiment described above with reference to FIGS. 6A to 8D, the metal cutting blade 52*a* is set to have the thickness 52*w* which is larger than the cutting edge thickness 51*w* of the substrate cutting blade 51*a* but smaller than two times the cutting edge thickness 51*w* of the substrate cutting blade 51*a*, and, in the first cutting step, the laminate substrate W is cut twice along one scheduled division line L by use of the substrate cutting blade 51*a* to form the first cut groove M1 having a width corresponding to two times the cutting edge thickness 51*w* of the substrate cutting blade 51*a*.

In this example, in the first cutting step, cutting is conducted twice along one scheduled division line L, so that the first cut groove M1 having a width larger than the cutting edge thickness 52*w* of the metal cutting blade 52*a* can be formed. In this manner, the number of times of cutting along one scheduled division line L in the first cutting step can be designed according to a relation between the cutting edge thicknesses of the two blades 51*a* and 52*a*. In addition, according to this example, the first cutting groove M1 can be formed by a minimum number of times (twice) of cutting, so that shortening of processing time can be realized.

FIGS. 9A to 11D are diagrams for explaining the first and second cutting steps according to another embodiment of the present invention. According to this embodiment, in the first cutting step, the laminate substrate W is cut twice along one scheduled division line L by use of the substrate cutting blade 51*a* to form a first cut groove MA in which two cut grooves Ma are formed and an uncut residual part K having a width smaller than the cutting edge thickness 52*w* of the metal cutting blade 52*a* is formed along the scheduled division line L between the two cut grooves Ma, and, in the second cutting step, the intermediate layer 30 is cut together with the uncut residual part K by use of the metal cutting blade 52*a*.

Figures 9A, 9B, 9C, 9D, 9E, 9F:
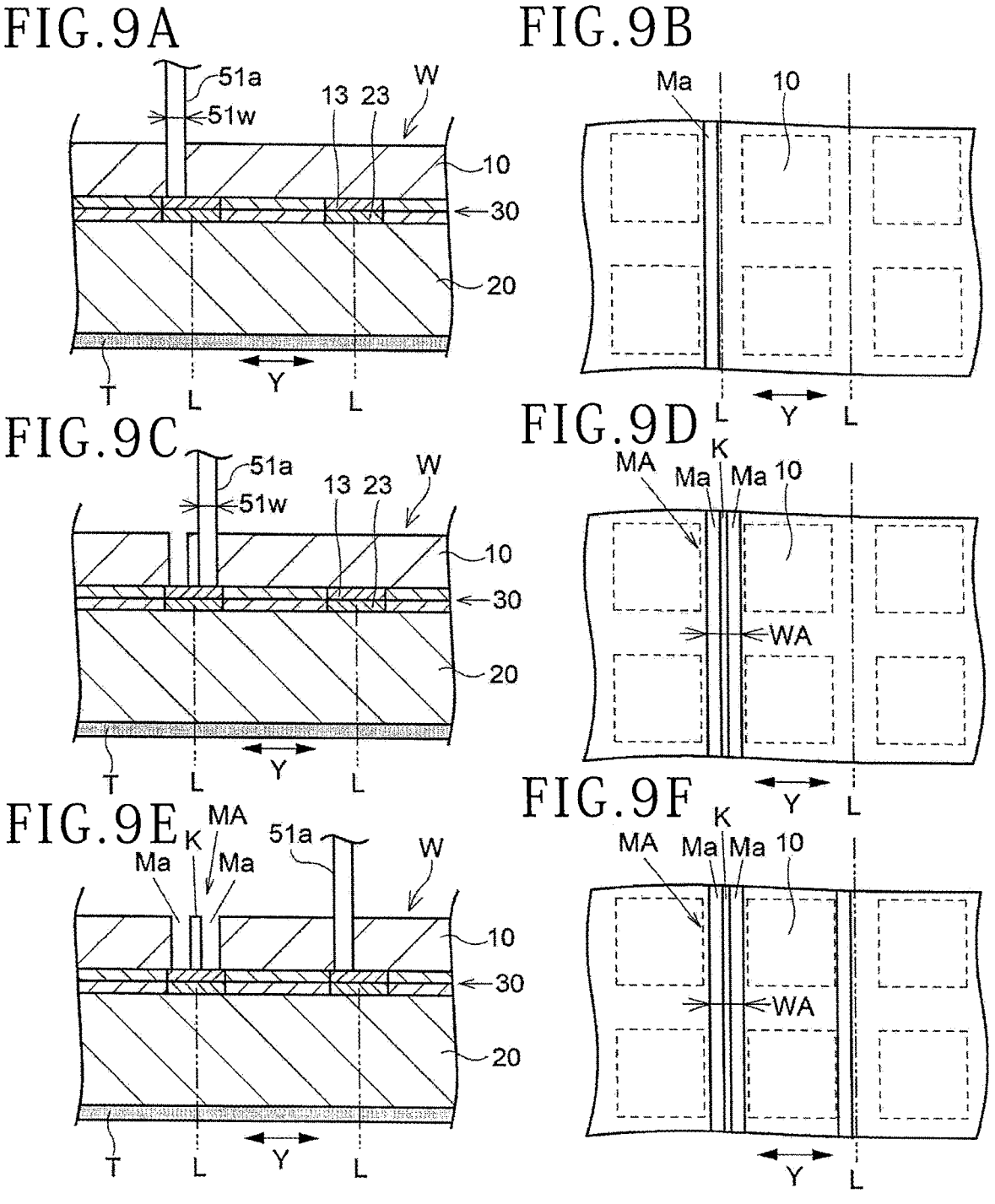
FIGS. 9A to 9F are diagrams for explaining the first cutting step of the processing method according to another embodiment of the present invention.

Specifically, as depicted in FIG. 9A, in regard of the first substrate 10, the substrate cutting blade 51*a* is positioned in such a manner that the center position of the cutting edge is deviated to one side from the position of the scheduled division line L, and groove forming for a first groove is conducted along the scheduled division line L to form a cut groove Ma. Next, as depicted in FIG. 9C, the substrate cutting blade 51*a* is positioned in such a manner that the center position of the cutting edge is deviated to the other side from the position of the scheduled division line L, and groove forming for a second groove is conducted along the scheduled division line L to form another cut groove Ma. In this instance, the center position of the substrate cutting blade 51*a* is set at positions deviated from the scheduled division line L such that an uncut residual part K is formed between the first cut groove Ma and the second cut groove Ma.

In this manner, as depicted in FIGS. 9C to 9F, a first cut groove MA having the two cut grooves Ma and the uncut residual part K therebetween is formed. A width WA of the first cut groove MA is in a range narrower than the width of the streets 13 and 23 but is larger than the cutting edge thickness 52*w* of the metal cutting blade 52*a* to be used later in the second cutting step. In addition, the width of the uncut residual part K is narrower than the cutting edge thickness 52*w* of the metal cutting blade 52*a* and is set to such a width as to be removed by use of the metal cutting blade 52*a* in the second cutting step conducted later.

Next, as depicted in FIGS. 10A to 10D, in the second cutting step, the metal cutting blade 52*a* is made to cut into the intermediate layer 30, while removing the uncut residual part K by cutting into the uncut residual part K, to form a second cut groove M2.

Figure 10A:
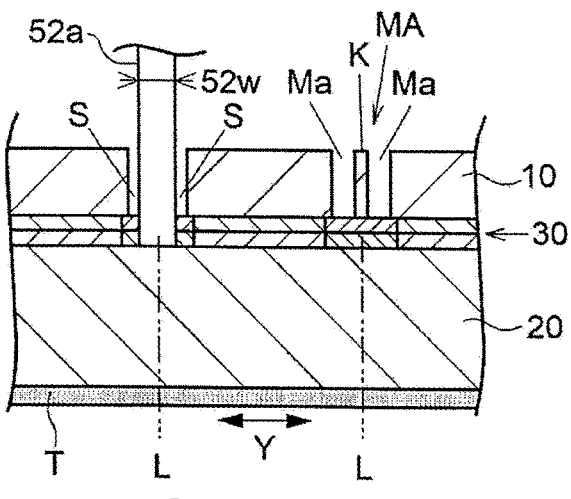
FIGS. 10A to 10D are diagrams for explaining the second cutting step of the processing method according to the other embodiment.
Figure 10B:
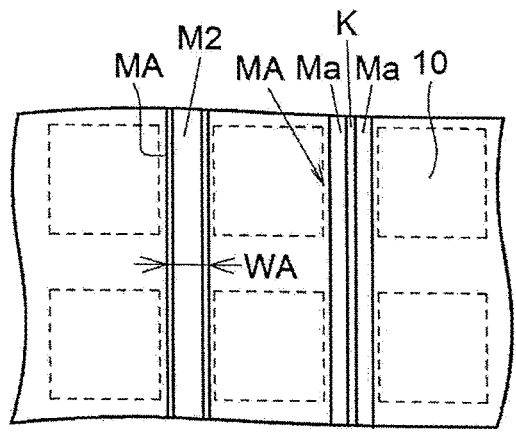
Figure 10C:
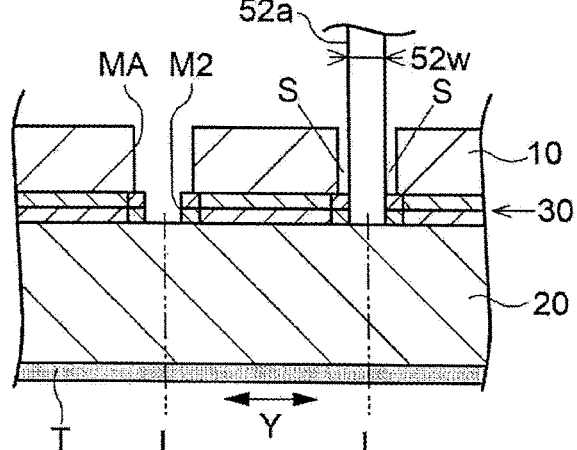
Figure 10D:
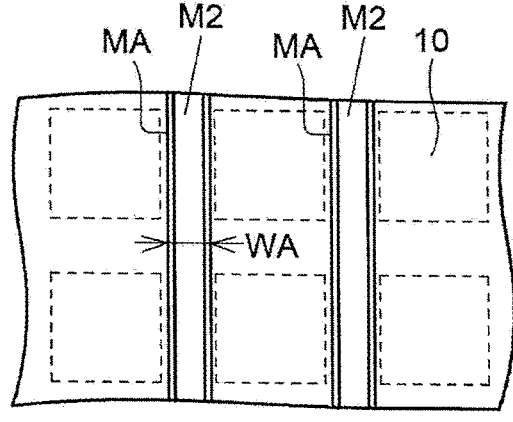
Figure 11A:
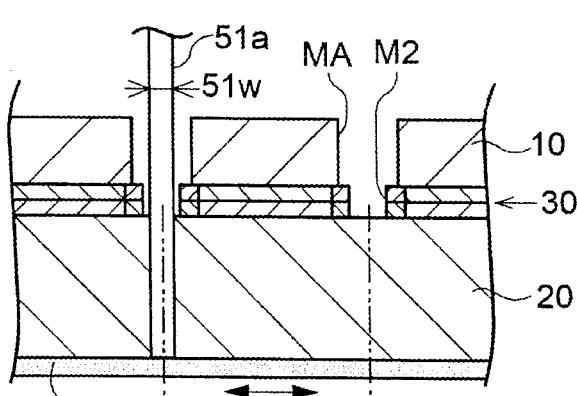
FIGS. 11A to 11D are diagrams for explaining the third cutting step of the processing method according to the other embodiment.
Figure 11B:
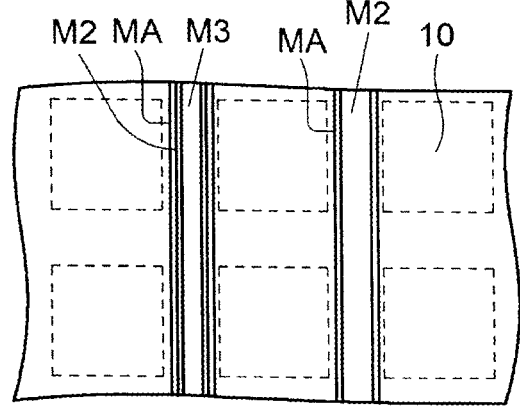
Figure 11C:
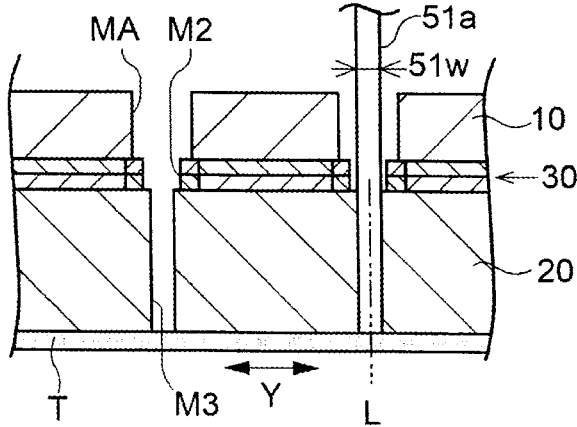
Figure 11D:
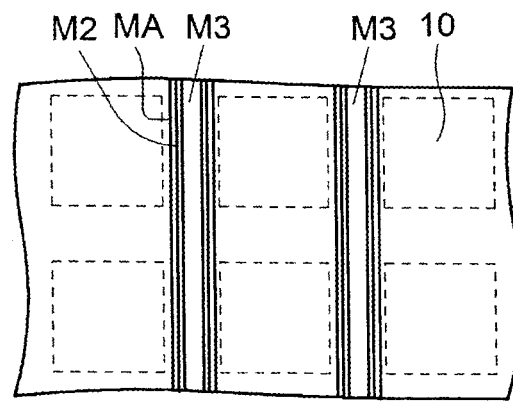

Here, as depicted in FIGS. 10A and 10B, the uncut residual part K is cut by use of the metal cutting blade 52*a*, but since the cut grooves Ma have been formed on opposite sides of the uncut residual part K, a gap S can be secured between the first substrate 10 and the metal cutting blade 52*a*, so that chipping can be prevented from being generated in the first substrate 10. In other words, worsening of processing quality due to cutting of the first substrate 10 by use of the metal cutting blade 52*a* can be prevented.

Subsequently, as depicted in FIGS. 11A to 11D, along the second cut groove M2 formed at that part of the intermediate layer 30 which corresponds to the streets 13 and 23, the substrate cutting blade 51*a* is made to cut into the second substrate 20 to perform groove forming, so that a third cut groove M3 is formed in a bottom of the second cut groove M2.

In the embodiment described above, the uncut residual part K is left uncut in the first cutting step, and the uncut residual part K is removed in the second step. This embodiment is particularly effective in that processing time can be shortened in a case where the cutting edge thickness 52*w* of the metal cutting blade 52*a* is large and where it is desired to secure the width WA of the first cut groove MA to be wide. In other words, for example, if a first cut groove MA having the width WA is to be formed without leaving an uncut residual part K, cutting needs to be conducted three times along one scheduled division line L, but, in the above embodiment, the formation of the first cut groove MA can be finished by two times of cutting, so that processing time can be shortened. In other words, that part of the first substrate 10 (for example, silicon) which overlaps a region to be cut by use of the metal cutting blade 52*a* can be removed by a minimum number of times of cutting.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for dividing, along a plurality of intersecting scheduled division lines, a laminate substrate in which a first substrate and a second substrate formed of a material same as that of the first substrate are laminated with each other through an intermediate layer containing metal, the processing method comprising:

a blade preparing step of preparing a substrate cutting blade and a metal cutting blade larger in cutting edge thickness than the substrate cutting blade;

a support member disposing step of disposing a support member on the second substrate side of the laminate substrate;

a holding step of holding the laminate substrate by a holding table through the support member such that the first substrate is exposed;

a first cutting step of cutting the laminate substrate held by the holding table along the scheduled division lines by use of the substrate cutting blade to form the first substrate with first cut grooves each having a width larger than the cutting edge thickness of the metal cutting blade;

a second cutting step of, after the first cutting step is carried out, cutting the laminate substrate held by the holding table along the first cut grooves by use of the metal cutting blade to cut the intermediate layer and to form second cut grooves each having a width corresponding to the cutting edge thickness of the metal cutting blade; and a third cutting step of, after the second cutting step is carried out, cutting the laminate substrate held by the holding table along the second cut grooves by use of the substrate cutting blade to divide the second substrate, thereby dividing the laminate substrate, wherein, in the first cutting step, the substrate cutting blade is relatively moved multiple times in an indexing-feed direction with respect to each scheduled division line to thereby carry out cutting multiple times along the scheduled division line.

2. The processing method according to claim 1, wherein the metal cutting blade is set to have a thickness larger than the cutting edge thickness of the substrate cutting blade but smaller than two times the cutting edge thickness of the substrate cutting blade, and in the first cutting step, the laminate substrate is cut twice along each scheduled division line by use of the substrate cutting blade to form the first cut grooves each having a width corresponding to two times the cutting edge thickness of the substrate cutting blade.

3. The processing method according to claim 1, wherein, in the first cutting step, the laminate substrate is cut twice along each scheduled division line by use of the substrate cutting blade to form the first cut groove in which two cut grooves are formed and an uncut residual part having a width smaller than the cutting edge thickness of the metal cutting blade is formed along the scheduled division line between the two cut grooves, and in the second cutting step, the intermediate layer is cut together with the uncut residual part by use of the metal cutting blade.

* * * * *